(12) United States Patent  
Misao

(10) Patent No.: US 11,353,804 B2  
(45) Date of Patent: Jun. 7, 2022

(54) IMAGE FORMING APPARATUS

(71) Applicant: CANON KABUSHIKI KAISHA, Tokyo (JP)

(72) Inventor: Yoji Misao, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/884,574

(22) Filed: May 27, 2020

(65) Prior Publication Data

US 2020/0379355 A1  Dec. 3, 2020

(30) Foreign Application Priority Data

May 31, 2019  (JP) .............................. JP2019-102856

(51) Int. Cl.
*B41J 2/44* (2006.01)
*B41J 2/45* (2006.01)
*B41J 2/455* (2006.01)
*B41J 2/47* (2006.01)
*G03G 13/04* (2006.01)
*G03G 13/06* (2006.01)
*G03G 13/20* (2006.01)
*G03G 15/01* (2006.01)
*G03F 7/20* (2006.01)

(52) U.S. Cl.
CPC ............ *G03G 15/011* (2013.01); *B41J 2/442* (2013.01); *B41J 2/45* (2013.01); *B41J 2/455* (2013.01); *G03F 7/70025* (2013.01); *G03G 13/04* (2013.01); *G03G 13/06* (2013.01); *G03G 13/20* (2013.01); *G03G 15/0121* (2013.01); *G03G 15/0142* (2013.01)

(58) Field of Classification Search
CPC ..... B41J 2/442; B41J 2/45; B41J 2/455; B41J 2/47; G03G 13/045; G03G 13/06; G03G 13/20; G03G 15/011; G03G 15/0121; G03G 15/0142
See application file for complete search history.

(56) References Cited

U.S. PATENT DOCUMENTS 6,246,705 B1 *  6/2001  Kasai ................... G02B 26/127  
    250/234  
2011/0235142 A1 *  9/2011  Kusuda ................ G02B 26/121  
    359/197.1

FOREIGN PATENT DOCUMENTS

JP  2009-269353 A  11/2009  
JP  2016-163949 A  9/2015

* cited by examiner

*Primary Examiner* — Matthew Luu  
*Assistant Examiner* — Kendrick X Liu  
(74) *Attorney, Agent, or Firm* — Canon U.S.A., Inc. I.P. Division

(57) ABSTRACT

An image forming apparatus includes a unit configured to perform image forming operation, a unit board in the unit, a wiring configured to be connected to the unit board, and a control board configured to be connected to the unit board with the wiring and control the unit. The unit board includes a connector to which the wiring is to be connected. A length of the connector in a longitudinal direction of the connector is longer than a length of the unit board in a widthwise direction of the unit board, and the longitudinal direction of the connector intersects the widthwise direction of the unit board.

6 Claims, 5 Drawing Sheets

IMAGE FORMING APPARATUS

BACKGROUND OF THE DISCLOSURE

Field of the Disclosure

The present disclosure relates to an electrical connection configuration to be used in an image forming apparatus, e.g., a copying machine, a printer, or a facsimile, having a function of forming an image on a recording medium, such as a sheet.

Description of the Related Art

In typical image forming apparatuses, a configuration has been available in which an insertion opening for inserting an optical scanner is provided in a side face of the image forming apparatus, and a connector unit for electrically connecting the optical scanner and the image forming apparatus is provided near the insertion opening, which facilitates replacement of the optical scanner, as discussed in Japanese Patent Application Laid-Open No. 2014-262546. In another available configuration, an opening is provided in a side face of an image forming apparatus, and a signal line is inserted into the opening to electrically connect the image forming apparatus and an optical scanner, so that the image forming apparatus can be downsized while a work area for connecting the signal line is secured as discussed in Japanese Patent Application Laid-Open No. 2008-123798.

In recent years, downsizing of image forming apparatuses has been more being demanded than before. To downsize an image forming apparatus, it is necessary to downsize internal units, such as an optical scanner and various sensors, as well. In general, a control board and an internal unit are electrically connected by a bundle wire, or a flexible cable, such as a flexible flat cable (FFC) and a flexible printed circuit (FPC).

A conducting wire, such as a bundle wire and a flexible cable, has a thickness determined based on the magnitude of electric current to be fed, and thus is not easily reduced in thickness. The number of conducting wires is also determined based on the number of signals, and thus is not easily reduced. It is therefore difficult to reduce the width of a bundle wire or flexible cable to be connected to an internal unit requiring a complicated control, so that downsizing of the internal unit is hindered.

SUMMARY OF THE DISCLOSURE

In view of such an issue, the present disclosure is directed to an image forming apparatus in which an increase in size of a unit in the image forming apparatus due to a large width of a connector joint portion is prevented.

According to an aspect of the present disclosure, an image forming apparatus includes a unit configured to perform image forming operation, a unit board in the unit, a wiring configured to be connected to the unit board, and a control board configured to be connected to the unit board with the wiring and control the unit. The unit board includes a connector to which the wiring is to be connected. A length of the connector in a longitudinal direction of the connector is longer than a length of the unit board in a widthwise direction of the unit board, and the longitudinal direction of the connector intersects the widthwise direction of the unit board.

According to another aspect of the present disclosure, an image forming apparatus includes a unit configured to acquire information about image forming operation, a unit board in the unit, a wiring configured to be connected to the unit board; and, a control board configured to be connected to the unit board with the wiring and control the unit. The unit board includes a connector to which the wiling is to be connected. A length of the connector in a longitudinal direction of the connector is longer than a length of the unit board in a widthwise direction of the unit board, and the longitudinal direction of the connector intersects the widthwise direction of the unit board.

Further features and aspects of the present disclosure will become apparent from the following description of example embodiments with reference to the attached drawings.

DESCRIPTION OF THE EMBODIMENTS

Various embodiments, features and aspects of the present disclosure will be described in detail below as examples, with reference to the drawings. However, shapes and relative positions of components described in each of these embodiments may be appropriately modified depending on a configuration and various conditions of an apparatus to which the present disclosure is applied, and are not intended to limit the scope of the present disclosure to the following embodiments.

Overall Configuration of Example Image Forming Apparatus

Figure 3:
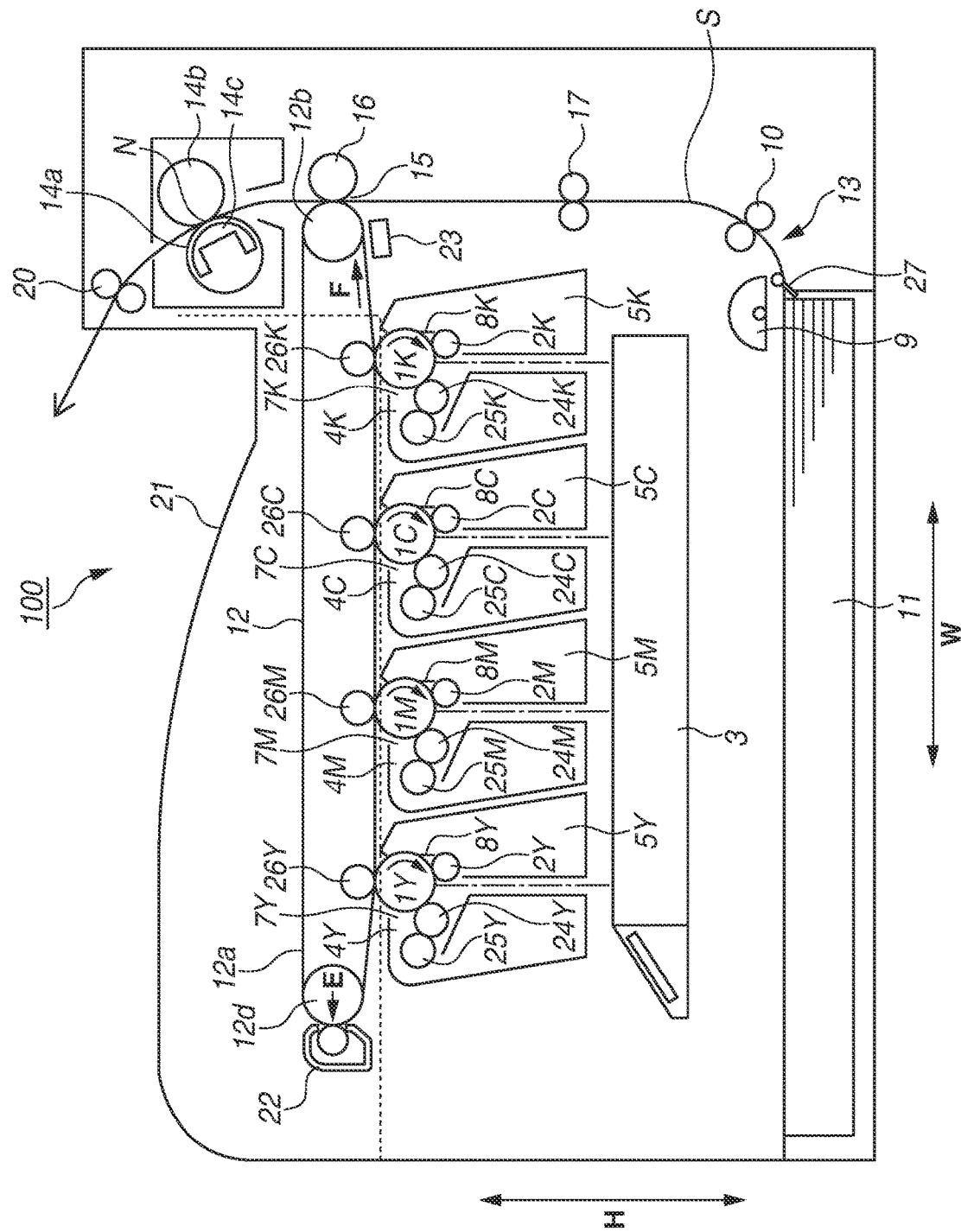
FIG. 3 is a diagram illustrating an overall configuration of an image forming apparatus according to another example of an embodiment.

An overall configuration of an image forming apparatus will be described with reference to FIG. 3. FIG. 3 is a longitudinal cross-sectional diagram illustrating an overall configuration of a color laser beam printer 100 that is an example of an image forming apparatus according to each of example embodiments of the present disclosure. Examples of the image forming apparatus include a copying machine and a facsimile, in addition to a color laser beam printer.

The color laser beam printer 100 includes four photosensitive drums 1 (1Y, 1M, 1C, and 1K). Around each of the photosensitive drums 1, a charging unit (a charging roller) 2, an exposure device (an optical scanner) 3, a development unit 4, a transfer unit (a primary transfer roller) 26, and a cleaning unit (a cleaner unit) 5 are disposed in this order in a rotation direction of the photosensitive drum 1. The charging unit 2 (2Y, 2M, 2C, and 2K) uniformly charges the surface of the photosensitive drum 1. The exposure device 3 emits a laser beam based on image information, so that an electrostatic latent image is formed on the photosensitive drum 1. The development unit 4 (4Y, 4M, 4C, and 4K) attaches toner to the electrostatic latent image, so that a toner image is visualized. The transfer unit 26 (26Y, 26M, 26C, and 26K) transfers the toner image on the photosensitive drum 1 to an intermediate transfer member (an intermediate transfer belt unit) 12. The cleaner unit 5 (5Y, 5M, 5C, and 5K) includes a drum cleaning blade 8 (8Y, 8M, 8C, and 8K) and a waste toner container, and removes the toner remaining on the surface of the photosensitive drum 1 after the transfer. These configurations form an image forming unit.

In each of the present example embodiments, the photosensitive drum 1, the charging unit 2, the development unit 4, and the cleaner unit 5 are integrated into a process cartridge 7 (7Y, 7M, 7C, and 7K) that is attachable to and detachable from the color laser beam printer 100. These four process cartridges 7 (7Y to 7K) have similar structures, but are different in that these process cartridges 7 form respective images of toners of different colors, i.e., yellow (Y), magenta (M), cyan (C), and black (BK).

The photosensitive drums 1Y to 1K each serving as an image bearing member are each formed by an organic photo conductor (OPC) layer being applied to the outer peripheral surface of a cylinder made of aluminum. Each of the photosensitive drums 1Y to 1K has both ends each rotatably supported by a flange, and is rotated in a clockwise direction indicated by an arrow in FIG. 3, by receiving a driving force transmitted from a driving motor (not illustrated) at one of the ends. The charging units 2Y to 2K are each a conductive roller formed in the shape of a roller, and this roller is brought into contact with the surface of the corresponding one of the photosensitive drums 1Y to 1K and receives a charging bias voltage applied from a power supply (not illustrated), so that the surface of the photosensitive drum 1 is uniformly charged. The exposure device 3 is disposed below the process cartridges 7Y to 7K in a vertical direction, and performs exposure on each of the photosensitive drums 1Y to 1K based on an image signal. The development unit 4 includes a development roller 24 (24Y, 24M, 24C, and 24K), a toner applying roller 25 (25Y, 25M, 25C, and 25K), and a toner container that contains the toner of the corresponding color. The development roller 24 is adjacent to the surface of the photosensitive drum 1 and is rotated by a driving unit (not illustrated). The development rollers 24Y to 24K each performs development by receiving a development bias voltage applied by a development bias power supply (not illustrated).

With the above-described configuration, after the photosensitive drums 1Y to 1K are charged to a predetermined potential of negative polarity by the charging rollers 2Y to 2K, an electrostatic latent image is formed on each of the photosensitive drums 1Y to 1K with the exposure device 3. This electrostatic latent image is subjected to reversal development with each of the development units 4Y to 4K, so that the toner of negative polarity is attached to this electrostatic latent image. As a result, a toner image of each of Y, M, C, and BK is formed.

In the intermediate transfer belt unit 12, an intermediate transfer belt 12a is stretched by a driving roller 12b and a tension roller 12d, and the tension roller 12d exerts tension in an arrow-E direction. Further, the primary transfer rollers 26Y to 26K are disposed inside the intermediate transfer belt 12a to face the respective photosensitive drums 1Y to 1K, and are each configured to receive a transfer bias applied by a bias application device (not illustrated). Each of the photosensitive drums 1Y to 1K rotates in the corresponding arrow direction, the intermediate transfer belt 12a rotates in an arrow-direction, and a bias of positive polarity is applied to the primary transfer rollers 26Y to 26K. The toner images formed on the respective photosensitive drums 1Y to 1K are thus primarily transferred sequentially onto the intermediate transfer belt 12a starting from the toner image on the photosensitive drum 1Y, and conveyed to a secondary transfer portion 15, in a state where the toner images of four colors are superimposed on one another.

A feeding device 13 includes a sheet feeding roller 9 that feeds sheets S from a sheet feeding cassette 11 holding the sheets (transfer materials) S, and a conveyance roller pair 10 that conveys the fed sheets S. The sheet feeding cassette 11 is configured to be drawn frontward to be removed from an apparatus main body in FIG. 3. A user draws and removes the sheet feeding cassette 11 from the apparatus main body, places the sheets S in the removed sheet feeding cassette 11, and then inserts the sheet feeding cassette 11 into the apparatus main body, so that sheet supply is completed. The sheets S held in the sheet feeding cassette 11 are pressure contacted with the sheet feeding roller 9, separated one by one by a separating pad 27 (a friction piece separation method), and then conveyed. The sheet S conveyed from the feeding device 13 is conveyed to the secondary transfer portion 15 by a registration roller pair 17. Onto the sheet S conveyed to the secondary transfer portion 15, the toner images of four colors on the intermediate transfer belt 12a are secondarily transferred by a secondary transfer roller 16.

A fixing unit 14 serving as a fixing device fixes an image formed on the sheet S by applying heat and pressure to this image. The fixing unit 14 includes a fixing belt 14a having a cylindrical shape, a pressing roller 14b having elasticity, and a belt guide member 14c including a heating unit, such as a heater. The pressing roller 14b and the belt guide member 14c form a fixing nip portion N with a predetermined pressure contact force, via the fixing belt 14a guided by the belt guide member 14c. The fixing nip portion N has a predetermined width. The pressing roller 14b is rotated by a driving device (not illustrated), and the fixing belt 14a having the cylindrical shape rotates accordingly, so that the fixing belt 14a is heated by an internal heater (not illustrated). In a state where the fixing nip portion N is heated and adjusted to a predetermined temperature, the sheet S on which an unfixed toner image is formed is conveyed from the image forming unit, and guided to a position, the fixing nip portion N, between the fixing belt 14a and the pressing roller 14b, with an image side facing upward, i.e., facing the surface of the fixing belt 14a. Subsequently, the sheet S is pinched and conveyed together with the fixing belt 14a through the fixing nip portion N, with the image side in intimate contact with the outer surface of the fixing belt 14a in the fixing nip portion N.

In this process of pinching and conveying the sheet S together with the fixing belt 14a through the fixing nip portion N, the unfixed toner image on the sheet S is heated by the heater in the fixing belt 14a. The sheet S after fixing is discharged to a sheet discharge tray 21 by a sheet discharge roller pair 20. Meanwhile, after the toner image transfer, the toner remaining on the surface of the photosensitive drum 1 is removed by the drum cleaning blade 8, and the removed toner is collected in the waste toner container in the cleaner unit 5. Further, the toner remaining on the intermediate transfer belt 12a after the secondary transfer to the sheet S is removed by a transfer belt cleaning device 22. This removed toner is collected in a waste toner collecting container (not illustrated) disposed at an apparatus deep-surface portion, after passing through a waste toner conveyance path (not illustrated).

Example Exposure Device

Figure 1A:
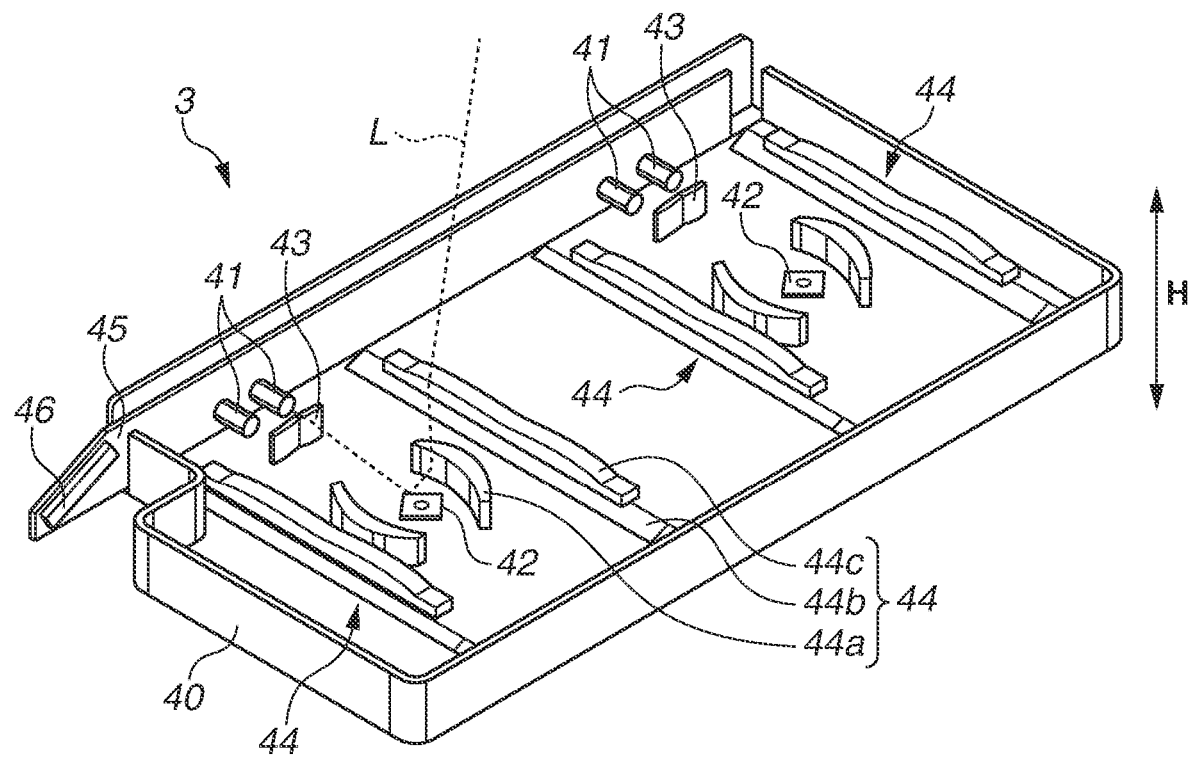
FIGS. 1A and 1B are a perspective view and an enlarged view, respectively, of an optical scanner according to a first example embodiment.
Figure 1B:
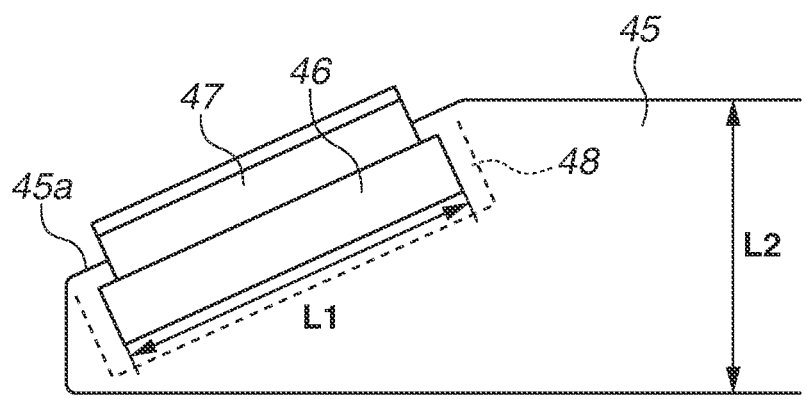
Figure 2:
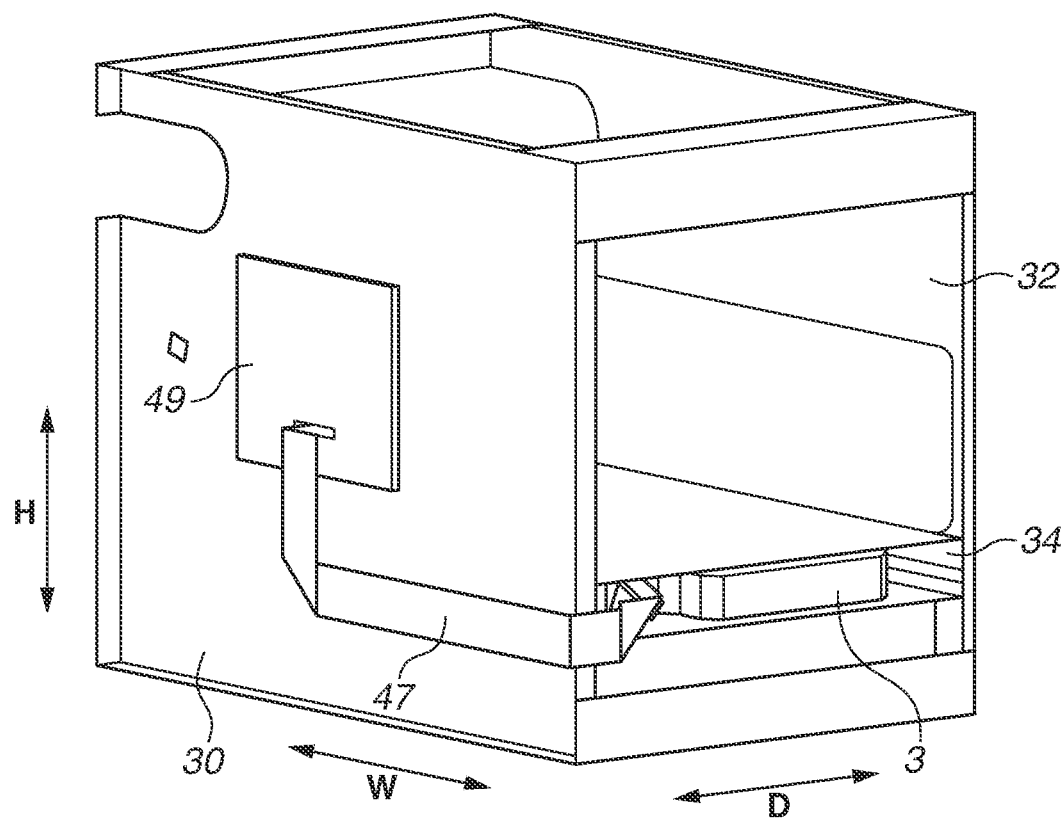
FIG. 2 is a perspective of a frame of an apparatus main body and the optical scanner according to the first example embodiment.

The exposure device 3 will be described below. FIG. 1A is a perspective view of the exposure device 3 (a unit)

according to a first example embodiment, and FIG. 1B is an enlarged view of a laser driving board 45 (a unit board) as viewed from front. FIG. 1A illustrates a state without a cover member to illustrate an inner structure of an optical box (a housing) 40 of the exposure device 3. FIG. 2 is a diagram illustrating a positional relationship between a frame of the main body of the image forming apparatus 100 and the exposure device 3. FIG. 2 illustrates a vertical direction H, and a lateral direction W and a depth direction D in a horizontal direction.

The exposure device 3 is disposed below the plurality of image forming units, between a rear plate 30 and a front plate 32 that are included in the frame of the main body of the image forming apparatus 100. As illustrated in FIGS. 1A and 1B, the exposure device 3 includes the optical box 40 having a substantially rectangular parallelepiped shape, a light source 41 that is a plurality of semiconductor lasers, a deflection member 42, optical elements such as an incidence optical system 43 and an imaging-forming optical system 44, an electric wire bundle (not illustrated), and the laser driving board 45. A rotating polygon mirror of the deflection member 42 and optical elements including the incidence optical system 43 and the imaging-forming optical system 44 are contained in the optical box 40, and form an optical system.

The light source 41 is disposed on the laser driving board 45, and emits a laser beam modulated based on image information for each color input from a control board 49 into the laser driving board 45. Four laser beams L emitted from the four light sources 41 are incident on the deflection member 42 (rotating polygon mirror). The deflection member 42 includes a motor (not illustrated) for rotation and a driving circuit (not illustrated) for driving the motor.

Each of the light beams L deflected by the deflection member 42 is guided by the imaging-forming optical system 44 (an optical lens 44a, a mirror 44b, and an optical lens 44c) and travels along the corresponding optical path. The light beam L exposes the photosensitive drum 1 of the image forming unit to light through the corresponding irradiation window glass disposed at an upper part of the exposure device 3, thus performing image forming operation.

Here, the electric wire bundle, which includes wirings for electrical connection in the inside of the exposure device 3, includes a power supply electric wire for supplying power to the deflection member 42 and a signal line (a communication line) for transmitting a signal to the deflection member 42. The electric wire bundle connects the deflection member 42 and the laser driving board 45.

The laser driving board 45 is provided with a connector 46, connected by, for example, soldering in a joint area 48, and is electrically connected to the control board 49 on the rear plate 30 of the main body of the image forming apparatus 100 by a flexible cable 47 (FIG. 2). The laser driving board 45 is disposed on a side face of the optical box 40. More specifically, the widthwise direction of the laser driving board 45 is a rotation axial direction of the motor that rotates the deflection member 42, i.e., in the present example embodiment, the vertical direction H. The longitudinal direction of the laser driving board 45 is a longitudinal direction of a plane where the imaging-forming optical system 44 is disposed, i.e., in the present example embodiment, the lateral direction W.

The flexible cable 47 extends from the laser driving board 45 toward the outside of the color laser beam printer 100, and is routed to the control board 49 attached to the rear plate 30. The flexible cable 47 can be bent in the thickness direction of the flexible cable 47, but cannot be bent in the width direction of the flexible cable 47. Thus, the flexible cable 47 is routed while being appropriately bent in a direction intersecting the width direction of the flexible cable 47.

The flexible cable 47 includes a signal line for transmitting a signal to the light source 41, in addition to a power line for supplying power to the laser driving board 45. In the color laser beam printer 100 having such a complicated structure, it is difficult to reduce the number of power lines and signal lines. As a result, a width L1 of the connector 46 increases, as the length of the flexible cable 47 increases in the width direction (the longitudinal direction) in which the conducting wires of the flexible cable 47 are arranged.

Meanwhile, an electronic circuit board, such as a printed board provided with an electronic circuit element and the connector 46, is used for the laser driving board 45. Circuit (pattern) wirings provided on the electronic circuit board are formed at predetermined intervals in a direction in which the circuit wirings are arrayed (an array direction), on one surface of the electronic circuit board. It is desirable that the interval between the circuit wirings be a predetermined width or more, from the view point of forming the electronic circuit board, besides the viewpoint of ensuring that a creepage distance between wirings is formed. It is also desirable that the circuit wirings each have a predetermined width or more based on, for example, the magnitude of electric current to be fed. Thus, the laser driving board 45 increases in size depending on the widths of the plurality of circuit wirings connected to the connector 46 and the interval between the circuit wirings in the array direction, in the direction in which the plurality of circuit wirings connected to the connector 46 is arranged, although the width of the circuit wirings in the array direction is smaller than the width L1 of the connector 46. For this reason, in a case where the longitudinal direction of the connector 46 and the longitudinal direction of the laser driving board 45 are parallel, the plurality of circuit wirings connected to the connector 46 has to be bent to extend in the widthwise direction (the vertical direction H) of the laser driving board 45. Thus, it is difficult to downsize the laser driving board 45. In other words, it is difficult to reduce both of the width L1 of the connector 46 and a width L2 of the laser driving board 45 in the array direction of the circuit wirings connected to the connector 46.

Thus, the longitudinal direction of the connector 46 and the array direction of the circuit wirings connected to the connector 46 intersect to prevent an increase in each of the width L1 of the connector 46 and the width L2 of the laser driving board 45 in the present example embodiment. In other words, the longitudinal direction of the connector 46 intersects the longitudinal direction of the laser driving board 45.

As a result, even if the width L2 of the laser driving board 45 in the vertical direction is less than the width L1 of the connector 46 in the longitudinal direction, the flexible cable 47 can be electrically connected to the connector 46, so that an increase in the height of the exposure device 3 in the vertical direction can be prevented, and thus, the exposure device 3 can be downsized. Further, in the present example embodiment, the laser driving board 45 has a side 45a in proximity to the connector 46, the side 45a is substantially parallel to the longitudinal direction of the connector 46, and the flexible cable 47 can be inserted into the connector 46 from the side 45a. Accordingly, when inserting the flexible cable 47 into the connector 46, an operator can work without touching the laser driving board 45 with a hand. Further, in the present example embodiment, the connector 46 is disposed at a position accessible from an opening portion 34 (FIG. 2) of a frame, on a side facing the front plate 32 of the laser driving board 45. Thus, the operator can connect the flexible cable 47 in a state where the exposure device 3 is attached to the main body of the image forming apparatus 100, and can easily observe an area around the connector 46 of the flexible cable 47, so that the operator can reliably connect the connector without making a mistake.

A second example embodiment of the present disclosure will be described below. In the first example embodiment, the connector 46 on the laser driving board 45 of the exposure device 3 is disposed so that the longitudinal direction of the connector 46 intersects the longitudinal direction of the laser driving board 45 to downsize the exposure device 3. However, the present disclosure can be used to downsize a unit which is provided inside an image forming apparatus, and the applicability thereof is not limited to the laser driving board 45 of the exposure device 3, in the present example embodiment, an example in which the present disclosure is applied to a sensor unit 23 (a unit) of the image forming apparatus 100 will be described. In the present example embodiment, configurations similar to those of the first example embodiment are provided with the same reference numerals as those of the first example embodiment and will not be described, and differences will be mainly described.

Figure 4:
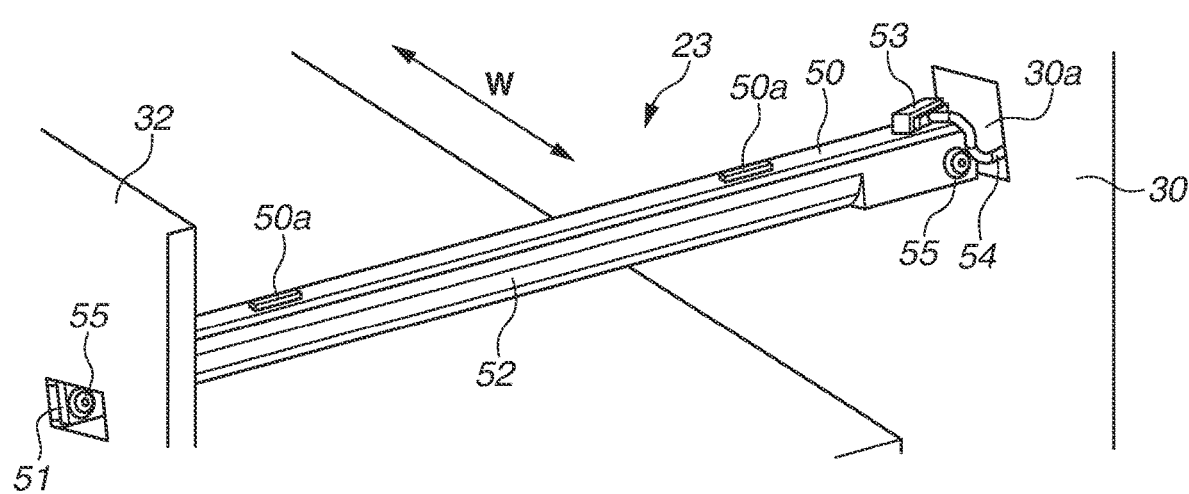
FIG. 4 is a perspective view of a frame of an apparatus main body and a sensor unit according to a second example embodiment.
Figure 5:
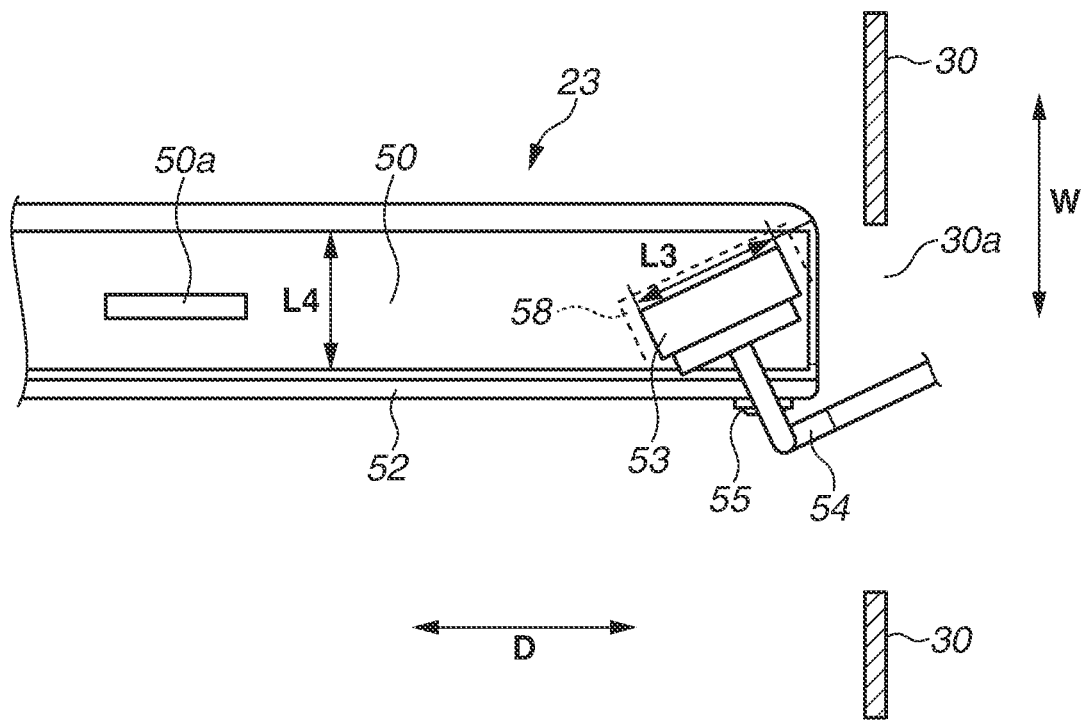
FIG. 5 is an enlarged view of the sensor unit according to the second example embodiment.

FIGS. 4 and 5 are a perspective view and an enlarged view, respectively, of the sensor unit 23 according to the present example embodiment. FIG. 4 illustrate a state without a part of a cover member of the sensor unit 23 for the sake of the description. The sensor unit 23 is provided to acquire image information (position information and shading information for an image pattern) of a toner image formed on the intermediate transfer belt 12a. The information acquired by the sensor unit 23 is transmitted to the control board 49, and an exposure position and a light quantity for exposure of the light beam L with respect to the photosensitive drum 1 is adjusted, thus obtaining a full color image of high quality.

The sensor unit 23 includes a sensor board 50 (a unit board) to which an image sensor 50a is attached at each of two positions in a longitudinal direction, a metal component 51 having rigidity, and a sensor cover 52. The sensor board 50 is provided with a connector 53 connected by, for example soldering, in a joint area 58, and is electrically connected to the control board 49 provided on the rear plate 30 of the main body of the image forming apparatus 100 by an electric wire bundle 54. The sensor board 50 is attached to the metal component 51. The sensor board 50 and the connector 53 are covered by the sensor cover 52, and the sensor cover 52 forms a part of a conveyance path. The sensor unit 23 is attached to the rear plate 30 and the front plate 32 of the main body of the image forming apparatus 100 by a member such as a screw 55 to face the intermediate transfer belt 12a. The intermediate transfer belt 12a is stretched by the driving roller 12b and the tension roller 12d, and circulates. The sensor unit 23 has a characteristic of detecting an image pattern formed on the intermediate transfer belt 12a, and thus, it is desirable that the positional relationship between the sensor unit 23 and the intermediate transfer belt 12a be stable. In the present example embodiment, the sensor unit 23 is disposed between the process cartridge 7K and the driving roller 12b as illustrated in FIG. 3.

The process cartridge 7K, the registration roller pair 17, and the secondary transfer portion 15 formed by the driving roller 12b and the secondary transfer roller 16 are disposed near the sensor unit 23. To downsize the image forming apparatus 100, it is desirable to downsize, for example, the sensor unit 23.

Meanwhile, to obtain a full color image of high quality, it is desirable to increase the number of image sensors, or to increase characteristic information to be detected. In such a case, the number of the electric wire bundles 54 tends to increase. This leads to an increase in a width L3 of the connector 53 in a longitudinal direction.

Further, an electronic circuit board such as a printed board provided with an electronic circuit element and the connector 53 is used for the sensor board 50. Circuit (pattern) wirings provided on the electronic circuit board are formed at predetermined intervals in a direction in which the circuit wirings are arrayed (array direction), on one surface of the electronic circuit board. It is desirable that the interval between the circuit wirings be a predetermined width or more, from the view point of forming the electronic circuit board, besides the viewpoint of ensuring that a creepage distance between wirings is formed. It is also desirable that the circuit wirings each have a predetermined width or more based on a factor such as the magnitude of electric current to be fed. Thus, the sensor board 50 increases in size depending on the width of the plurality of circuit wirings connected to the connector 53, and the interval between the circuit wirings in the array direction, in the direction in which the plurality of circuit wirings connected to the connector 53 is arranged, although the width of the circuit wirings in the array direction is smaller than the width L3 of the connector 53. For this reason, in a case where the longitudinal direction of the connector 53 and the longitudinal direction of the sensor board 50 are parallel, the plurality of circuit wirings connected to the connector 53 has to be bent to extend in the widthwise direction of the sensor board 50. Thus, it is difficult to downsize the sensor board 50. In other words, it is difficult to reduce both of the width L3 of the connector 53 and a width L4 of the sensor board 50 in the array direction of the circuit wirings connected to the connector 53.

Thus, the longitudinal direction of the connector 53 and the array direction of the circuit wirings connected to the connector 53 intersect to prevent an increase in each of the width L3 of the connector 53 and the width L4 of the sensor board 50 in the array direction of the circuit wirings connected to the connector 53 in the present example embodiment. In other words, the longitudinal direction of the connector 53 intersects the longitudinal direction of the sensor board 50.

As a result, even if the width L3 of the connector 53 is greater than the width L4 of the sensor board 50, the sensor board 50 can be downsized, and moreover, the sensor board 50 can be electrically connected to the connector 53 connected to the electric wire bundle 54 passing through an opening portion 30a provided in the rear plate 30. Further, whether the electric wire bundle 54 is inserted can be checked from the opening portion 30a and thus, workability can be improved.

While the present disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

This application claims the benefit of Japanese Patent Application No. 2019-102856, tiled May 31, 2019, which is hereby incorporated by reference herein in its entirety.

What is claimed is:

1. An image forming apparatus comprising:
a unit configured to perform an image forming operation;
a unit board provided in the unit;
a control board configured to control the unit; and
a wiring configured to connect between the unit board and the control board;
wherein the unit board includes a connector to which the wiring is to be connected, and
wherein a length of the connector in a longitudinal direction of the connector is longer than a length of the unit board in a widthwise direction of the unit board which is perpendicular to a longitudinal direction of the unit board, and the longitudinal direction of the connector obliquely intersects the widthwise direction of the unit board.

2. The image forming apparatus according to claim 1, wherein the connector is disposed at one end of the unit board in a longitudinal direction of the unit board, and a side at the one end of the unit board in the longitudinal direction of the unit board is substantially parallel to the longitudinal direction of the connector.

3. The image forming apparatus according to claim 1,
wherein the unit board includes a semiconductor laser, and a driving circuit for a deflection device that deflects a laser beam emitted from the semiconductor laser in a scanning manner, and
wherein the unit is an optical scanner including the deflection device, an optical element, and an optical box containing the deflection device and the optical element.

4. The image forming apparatus according to claim 1, wherein the wiring includes a flexible cable.

5. An image forming apparatus comprising:
a unit configured to acquire image information;
a unit board provided in the unit;
a control board configured to acquire the image information from the unit;
a wiring configured to connect between the unit board and the control board,
wherein the unit board includes a connector to which the wiring is to be connected, and
wherein a length of the connector in a longitudinal direction of the connector is longer than a length of the unit board in a widthwise direction of the unit board which is perpendicular to a longitudinal direction of the unit board, and the longitudinal direction of the connector obliquely intersects the widthwise direction of the unit board.

6. The image forming apparatus according to claim 5,
wherein the unit board includes an image sensor configured to detect a toner image which is formed on an intermediate transfer belt, and
wherein the unit is a sensor unit configured to acquire information about ]the toner image from the image sensor, and the control board is configured to control an exposure device that exposes a photosensitive drum [with light based on the information acquired by the sensor unit.

* * * * *